(12) United States Patent
Aoki

(10) Patent No.: US 6,340,907 B2
(45) Date of Patent: Jan. 22, 2002

(54) SCHMITT TRIGGER CIRCUIT HAVING INDEPENDENT THRESHOLD VOLTAGE SETTING TO PROVIDE HYSTERESIS

(75) Inventor: Mikio Aoki, Kanagawa (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/778,441

(22) Filed: Feb. 7, 2001

(30) Foreign Application Priority Data

Feb. 8, 2000 (JP) .......................................... 12-030444

(51) Int. Cl.[7] ................................................ H03K 3/12
(52) U.S. Cl. ...................................... 327/206; 327/205
(58) Field of Search ........................ 327/108–112, 205, 327/206

(56) References Cited

U.S. PATENT DOCUMENTS 6,084,456 A * 7/2000 Seol ........................... 327/206

FOREIGN PATENT DOCUMENTS

| JP | 57-75024 | 5/1982 |
| JP | 5-11550 | 2/1993 |

* cited by examiner

Primary Examiner—Kenneth B. Wells
(74) Attorney, Agent, or Firm—Hutchins, Wheeler & Dittmar

(57) ABSTRACT

Two inverting amplifier circuits, which each include an active load transistor and a switch transistor and are different from each other in threshold voltage, and a flip-flop circuit is provided to obtain an output signal having hysteresis characteristics. Further, a low-resistance load transistor for regulating the threshold voltage and a high-resistance load transistor for restricting a through current are provided to cope with low power supply voltage and small amplitude signal input. By virtue of this construction, the invention can provide a Schmitt trigger circuit which is less likely to undergo an influence of a variation in production conditions and a variation in properties of transistors and is free from the flow of a stationary current.

24 Claims, 8 Drawing Sheets

FIG.9

| ZONE | ① | ② | ③ | ④ | ⑤ |
|---|---|---|---|---|---|
| TRANSISTOR 11 | ON | ON | OFF | ON | ON |
| TRANSISTOR 12 | OFF | ON | ON | ON | OFF |
| TRANSISTOR 21 | OFF | ON | ON | ON | OFF |
| TRANSISTOR 22 | ON | ON | OFF | ON | ON |
| 1ST DECISION SIGNAL 10 | 1 | 1 | 0 | 1 | 1 |
| 2ND DECISION SIGNAL 20 | 1 | 0 | 0 | 0 | 1 |
| OUTPUT SIGNAL 5 | 0 | 0 | 1 | 1 | 0 |

SCHMITT TRIGGER CIRCUIT HAVING INDEPENDENT THRESHOLD VOLTAGE SETTING TO PROVIDE HYSTERESIS

FIELD OF THE INVENTION

The invention relates to a Schmitt trigger circuit, and particularly to a Schmitt trigger circuit wherein the threshold voltage is set in two inverting amplifier circuits independently of each other to provide hysteresis characteristics.

BACKGROUND OF THE INVENTION

Prior art techniques will be described in conjunction with FIGS. 6 and 7.

FIGS. 6 and 7 respectively illustrate a block diagram of a conventional Schmitt trigger circuit described in Japanese Patent Laid-Open No. 75024/1982 and a block diagram of a conventional Schmitt trigger circuit described in Japanese Utility Model Laid-Open No. 11550/1993. These Schmitt trigger circuit comprise two inverter circuits, different from each other in switching voltage (threshold voltage), and an R/S flip-flop circuit.

In FIG. 6, an R/S flip-flop circuit 618 comprises: an OR/NAND circuit 616 composed of a CMOS transistor; and an inverter circuit 615. CMOS inverters 611, 612 are provided in a set input system of flip-flop circuit 618, and CMOS inverters 613, 614 are provided in a reset input system of the flip-flop circuit 618. Thus, a Schmitt trigger circuit is constructed.

In this case, in order to obtain hysteresis characteristics, setting is performed in such a manner that, when the threshold voltages of inverters 611, 612, 613, and 614 are VT1, VT2, VT3, and VT4, respectively, a requirement of (VT1 =VT4)>(VT2=VT3) is satisfied.

On the other hand, in FIG. 7, two inverters of an inverter 713 and an inverter 714 different from each other in switching voltage (threshold voltage) are connected to respective inputs in a flip-flop comprising NAND gates 711 and 712 which have been connected so as to cross each other, and an input voltage Vin is applied to the input of each inverter. Thus, a Schmitt trigger circuit is constructed.

Here the inverter 713 comprises a p-channel transistor 716 and a high-resistance element 717 of polysilicon which have been connected in tandem between the power supply potential side and the ground potential side. The inverter 714 comprises a high-resistance element 718 of polysilicon and an n-channel transistor 719 which have been connected in tandem between the power supply potential side and the ground potential side.

Since the Schmitt trigger circuit shown in FIG. 6 comprises a CMOS transistor, no current flows when the input signal is in a stationary state, contributing to a reduction in power consumption. Due to a variation in conditions at the time of production and a variation in characteristics of each transistor, a variation in threshold voltage occurs in the inverters 611, 612, 613, 614. This greatly affects the hysteresis characteristics.

The Schmitt trigger circuit shown in FIG. 7 can improve hysteresis characteristics. In this Schmitt trigger circuit, however, a current flows also in the case where the input signal is in a stationary state. This leads to increased power consumption.

SUMMARY OF THE INVENTION

Accordingly, it is an object of the invention to provide a Schmitt trigger circuit which has improved hysteresis characteristics and is free from the flow of a stationary current.

According to the first feature of the invention, a Schmitt trigger circuit comprising:

a first inverting amplifier circuit comprising a first p-channel transistor, with a source connected to a power supply potential side, having a high set threshold voltage level and a first active load n-channel transistor with a source connected to a ground potential side, wherein the first p-channel transistor in its drain is connected to the first active load n-channel transistor in its drain and an input signal is supplied and connected to a gate in the first p-channel transistor while a first input signal level decision signal is output from the first p-channel transistor on its drain side;

a second inverting amplifier circuit comprising a second n-channel transistor, with a source connected to the ground potential side, having a low set threshold voltage level and a second active load p-channel transistor with a source connected to a power supply potential side, wherein the second n-channel transistor in its drain is connected to the second active load p-channel transistor in its drain and said input signal is supplied and connected to a gate in the second n-channel transistor while a second input signal level decision signal is output from the second n-channel transistor on its drain side; and a flip-flop circuit into which the first input signal level decision signal is input as one input while the second input signal level decision signal is input as another input, an output from the flip-flop circuit being used as an output signal, an inverted signal of the second input signal level decision signal being supplied and connected to the first active load n-channel transistor at its gate, an inverted signal of the first input signal level decision signal being supplied and connected to the second active load p-channel transistor at its gate.

Preferably, the Schmitt trigger circuit further comprises as a low-resistance load transistor for regulating the threshold voltage: a third p-channel transistor which is inserted into between the first p-channel transistor and the power supply potential side and has a gate connected to the ground potential; and a third n-channel transistor which is inserted into between the second n-channel transistor and the ground potential side and has a gate connected to the power supply potential.

Further, preferably, the Schmitt trigger circuit further comprises as a high-resistance load transistor for restricting a current: a fourth n-channel transistor which is inserted into between the first active load n-channel transistor and the ground potential side and has a gate connected to the power supply potential; and a fourth p-channel transistor which is inserted into between the second active load p-channel transistor and the power supply potential side and has a gate connected to the ground potential.

The Schmitt trigger circuit may comprise all of the third p-channel transistor and n-channel transistor and the fourth p-channel transistor and n-channel transistor.

The flip-flop circuit preferably comprises two two-input NAND circuits and one inversion circuit.

Alternatively, the flip-flop circuit may comprise two two-input NOR circuits and one inversion circuit.

Preferably, the Schmitt trigger circuit has been produced by a CMOS process.

BRIEF DESCRIPTION OF THE DRAWINGS

The invention will be explained in more detail in conjunction with the appended drawings, wherein:

FIG. 9 is a diagram illustrating the state of each section in a Schmitt trigger circuit of the invention according to the classification of input signal levels.

DESCRIPTION OF THE PREFERRED EMBODIMENTS

Preferred embodiments of the invention will be explained in conjunction with the accompanying drawings.

Figure 1:
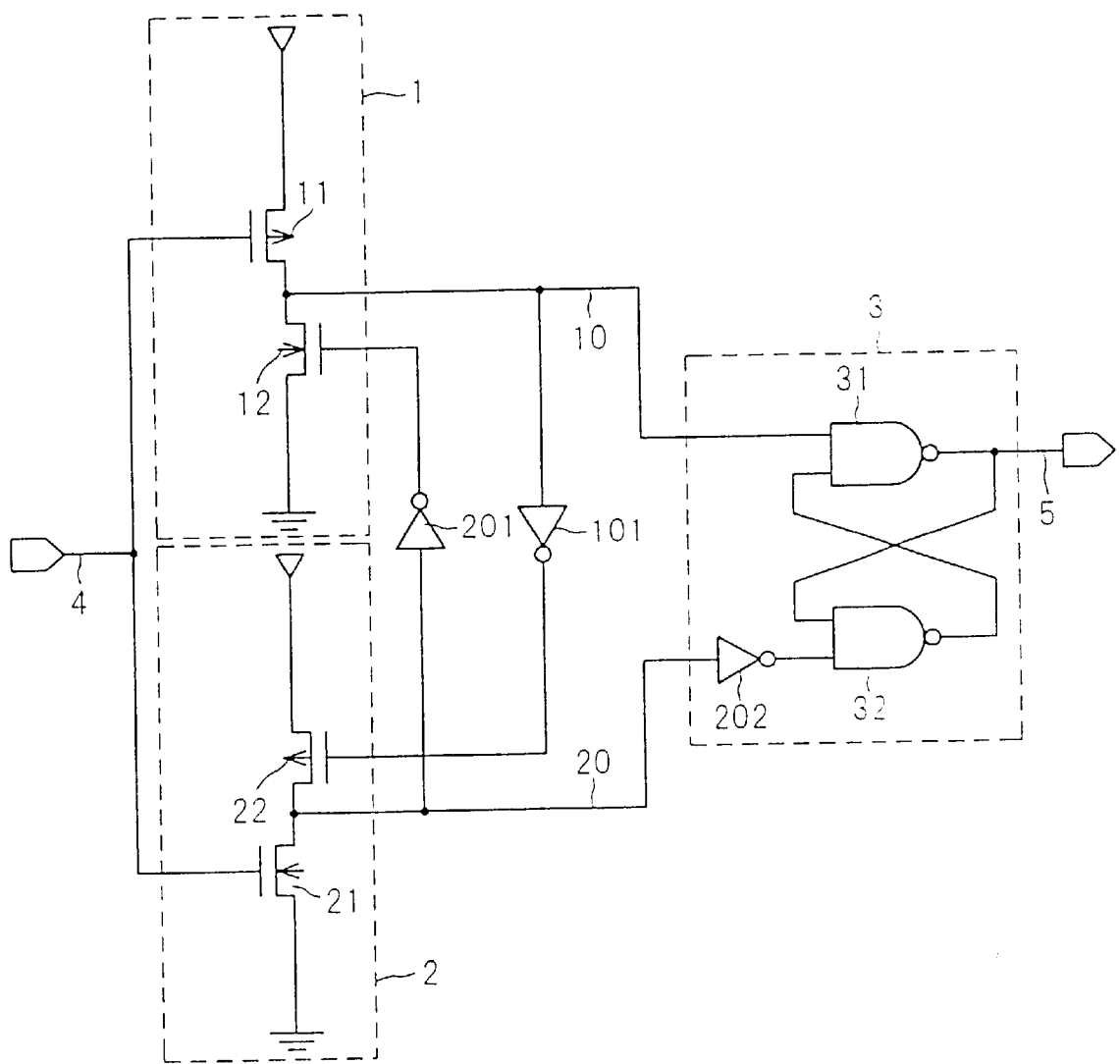
FIG. 1 is a block diagram illustrating the construction of a Schmitt trigger circuit according to the first preferred embodiment of the invention.

FIG. 1 is a block diagram illustrating the construction of a Schmitt trigger circuit according to the first preferred embodiment of the invention.

The Schmitt trigger circuit shown in FIG. 1 comprises: a first inverting amplifier circuit 1 comprising a first p-channel transistor 11, with a source connected to a power supply potential side, having a high set threshold voltage level and a first active load n-channel transistor 12 with a source connected to a ground potential side, wherein the first p-channel transistor 11 in its drain is connected to the first active load n-channel transistor 12 in its drain and an input signal 4 is supplied and connected to a gate in the first p-channel transistor 11 while a first input signal level decision signal 10 is output from the first p-channel transistor 11 on its drain side; a second inverting amplifier circuit 2 comprising a second n-channel transistor 21, with a source connected to the ground potential side, having a low set threshold voltage level and a second active load p-channel transistor 22 with a source connected to a power supply potential side, wherein the second n-channel transistor 21 in its drain is connected to the second active load p-channel transistor 22 in its drain and the input signal 4 is supplied and connected to a gate in the second n-channel transistor 21 while a second input signal level decision signal 20 is output from the second n-channel transistor 21 on its drain side; and a flip-flop circuit 3 such that the first input signal level decision signal 10 is connected to one of two inputs in a first two-input NAND circuit 31, the second input signal level decision signal 20 is connected through an inversion circuit 202 to one of two inputs in a second two-input NAND circuit 32, the output from the first two-input NAND circuit 31 is used as an output signal 5 and, in addition, is connected to the other input in the second two-input NAND circuit 32, and the output from the second two-input NAND circuit 32 is connected to the other input in the first two-input NAND circuit 31. In this case, an inverted signal obtained by inverting the second input signal level decision signal 20 through an inversion circuit 201 is supplied and connected to the first n-channel transistor 12 in its gate, and an inverted signal obtained by inverting the first input signal level decision signal 10 through an inversion circuit 101 is supplied and connected to the second p-channel transistor 22 in its gate.

Figure 8:
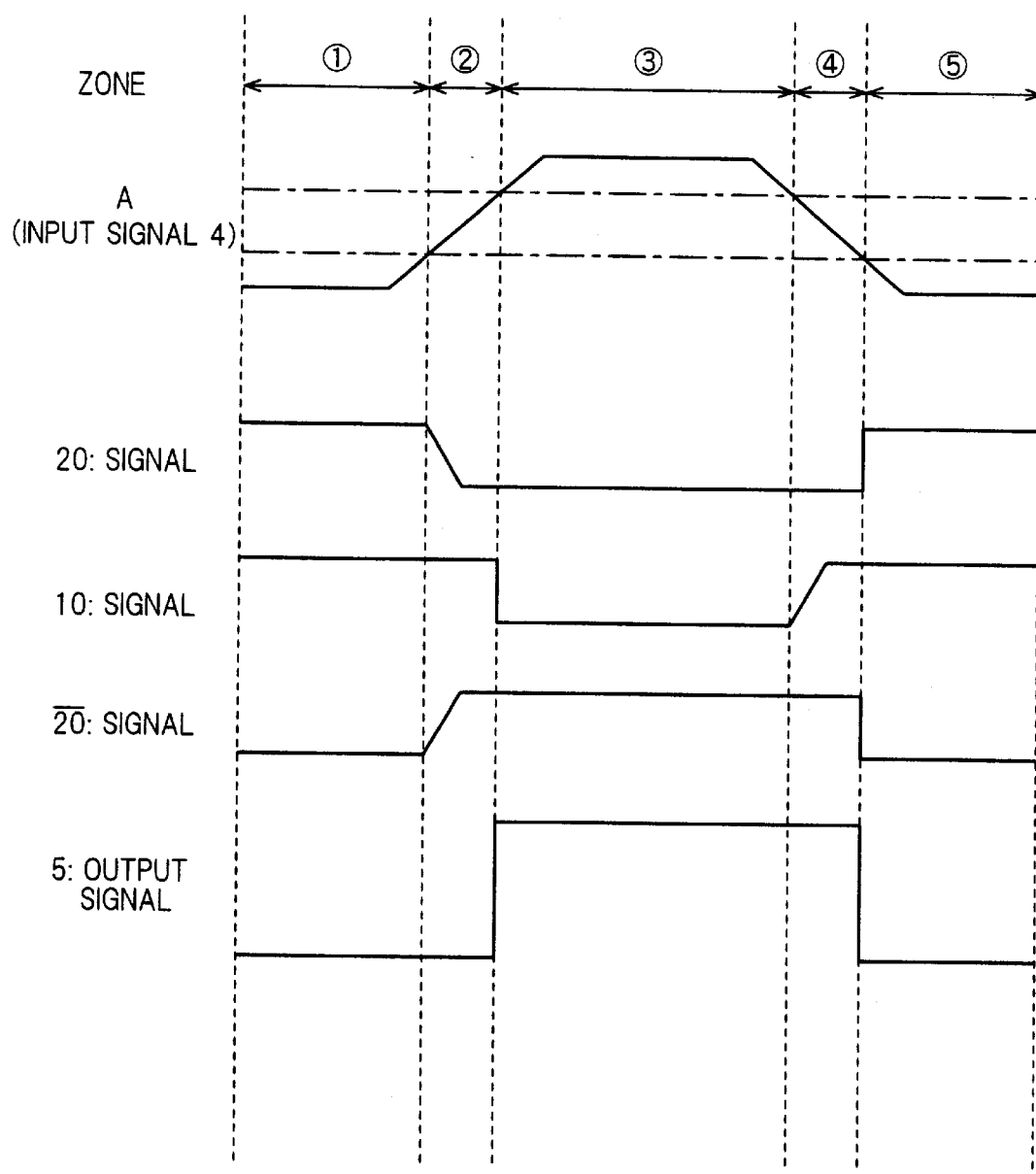
FIG. 8 is a time chart illustrating the operation of a Schmitt trigger circuit according to the invention.

FIG. 8 shows a time chart illustrating the operation of this Schmitt trigger circuit. Next, the operation of the Schmitt trigger circuit will be explained in conjunction with FIG. 8.

In FIG. 8, A shows a time chart for the input signal 4 which is divided into zones ① to ⑤ according to the input signal level. The operation of the Schmitt trigger circuit in each zone will be explained.

In the zone ①, the first p-channel transistor 11 in the first inverting amplifier circuit 1 is turned ON, while the second n-channel transistor 21 in the second inverting amplifier circuit 2 is turned OFF. At that time, the first input signal level decision signal 10 is brought to "logic level 1," and "logic level 0" is supplied to the gate in the second active load p-channel transistor 22. This permits the second active load p-channel transistor 22 to be turned ON, and the second input signal decision signal 20 is brought to "logic level 1." In this case, "logic level 0" is supplied to the first active load n-channel transistor 12 in its gate, so that the first active load n-channel transistor 12 is turned OFF. Therefore, at that time, "logic level 1" is supplied to the inputs in the flip-flop circuit 3, and the output signal 5 from the flip-flop circuit 3 is brought to "logic level 0."

In the zone ②, the first n-channel transistor 21 in the second inverting amplifier circuit 2 is changed to ON state, that is, together with the second active load p-channel transistor 22, is brought to ON state, so that the voltage level of the second input signal level decision signal 20 is changed to "logic level 0." At that time, "logic level 1" is supplied to the first active load n-channel transistor 12 in its gate. This permits the first active load n-channel transistor 12 to be brought to ON state. That is, the first active load n-channel transistor 12, together with the first p-channel transistor 11, is brought to ON state. In this case, however, the first input signal level decision signal 10 remains unchanged and is maintained on "logic level 1." Therefore, at that time, "logic level 1" is supplied to the two-input NAND circuit 31 in the flip-flop circuit 3, and "logic level 0" is supplied to the two-input NAND circuit 32. In this case, the output signal 5 remains unchanged, and is maintained on "logic level 0."

In the zone ③, the first p-channel transistor 11 in the first inverting amplifier circuit 1 is brought to OFF, and the first input signal level decision signal 10 is changed to "logic level 0." At that time, "logic level 1" is applied to the gate of the second active load p-channel transistor 22 in the second inverting amplifier circuit 2, and the second active load p-channel transistor 22 is brought to OFF state. Since, however, the second n-channel transistor 21 remains in the ON state, the second input signal level decision signal 20 remains unchanged and is maintained on "logic level 0." At that time, "logic level 0" is supplied to both the input in the NAND circuit 31 and the input in the NAND circuit 32 in the flip-flop circuit 3, and the output signal 5 is changed to "logic level 1."

In the zone ④, the first p-channel transistor 11 in the first inverting amplifier circuit 1 is brought to ON, and the first input signal level decision signal 10 is changed to "logic level 1." At that time, "logic level 0" is supplied to the gate of the second active load p-channel transistor 22 in the second inverting amplifier circuit 2, and the second active load p-channel transistor 22 is brought to ON state. Since, however, the second n-channel transistor 21 remains in the ON state, the second input signal level decision signal 20 remains unchanged and is maintained on "logic level 0." At that time, "logic level 1" is supplied to the input in the NAND circuit 31 in the flip-flop circuit 3, while "logic level 0" is supplied to the input in the NAND circuit 32 in the flip-flop circuit 3. In this case, the output signal 5 remains unchanged, and is maintained on "logic level 1."

In the zone ⑤, the second n-channel transistor 21 in the second inverting amplifier circuit 2 is brought to OFF state. Since the second active load p-channel transistor 22 remains in the ON state, the second input signal level decision signal 20 is changed to "logic level 1." At that time, "logic level 0" is supplied to the gate of the first active load n-channel transistor 12 in the first inverting amplifier circuit 1, and the first active load n-channel transistor 12 is brought to OFF state. Since the first p-channel transistor 11 remains in the ON state, the first input signal level decision signal is maintained on "logic level 1." In this case, "logic level 1" is supplied to both the input in the NAND circuit 31 and the input in the NAND circuit 32 in the flip-flop circuit 3, and the output signal 5 is changed to "logic level 0."

The state of each transistor in each of the above described zones and the logic level of each signal are summarized in FIG. 9.

Next, the Schmitt trigger circuit according to the second preferred embodiment of the invention will be explained.

Figure 2:
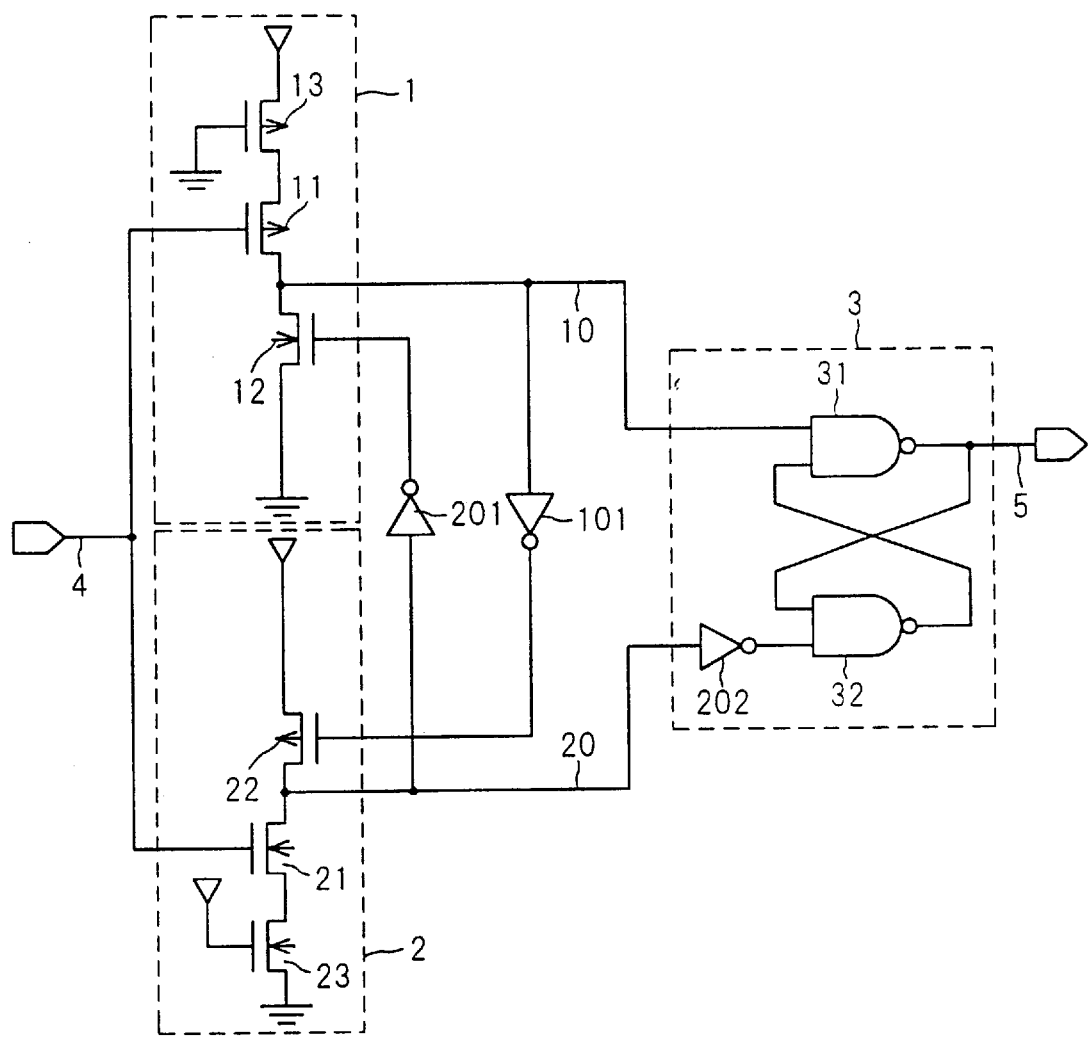
FIG. 2 is a block diagram illustrating the construction of a Schmitt trigger circuit according to the second preferred embodiment of the invention.

FIG. 2 is a block diagram of a Schmitt trigger circuit having a construction such that, in the above-described Schmitt trigger circuit, a third p-channel transistor 13 with a gate connected to a ground potential is inserted into between the first p-channel transistor 11 and the power supply potential side while a third n-channel transistor 23 with a gate connected to the power supply potential is inserted into between the second n-channel transistor 21 and the ground potential side, thereby enabling the regulation of the threshold voltage.

In FIG. 2, the third p-channel transistor 13 and the n-channel transistor 23 function as a low-resistance load transistor and shift the threshold voltage by the ON-state resistance to lower the threshold voltage of the first p-channel transistor while the threshold voltage of the second n-channel transistor 21 is increased. By virtue of this, the Schmitt trigger circuit can cope with the case where the input signal is a signal with small amplitude.

Next, the Schmitt trigger circuit according to the third preferred embodiment of the invention will be explained.

Figure 3:
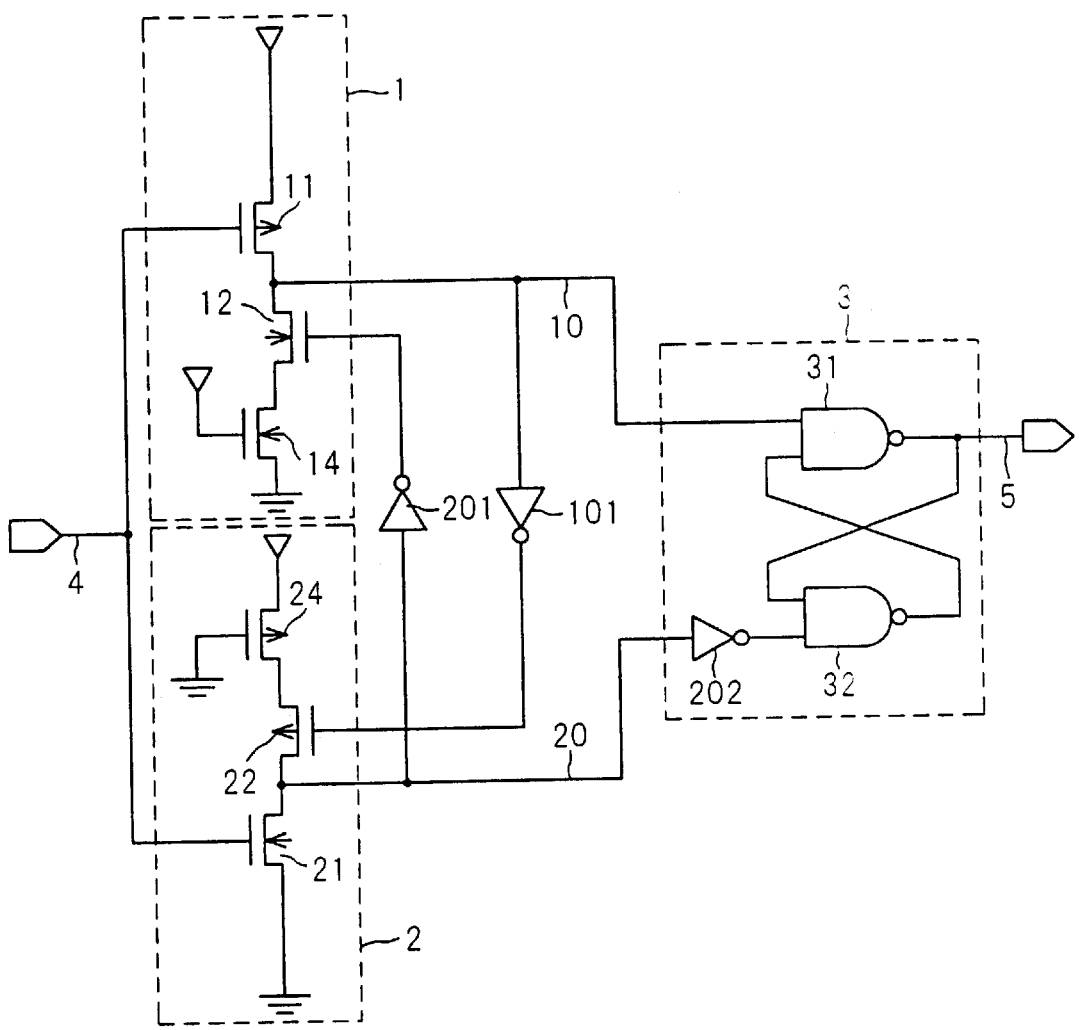
FIG. 3 is a block diagram illustrating the construction of a Schmitt trigger circuit according to the third preferred embodiment of the invention.

FIG. 3 is a block diagram of a Schmitt trigger circuit having a construction such that, in the Schmitt trigger circuit shown in FIG. 1, a fourth n-channel transistor 14 with a gate connected to a ground potential is inserted into between the first n-channel transistor 12 and the ground potential side while a fourth p-channel transistor 24 with a gate connected to the ground potential is inserted into between the second p-channel transistor 22 and the power supply potential side, thereby enabling the current flowing into the active load transistors 12 and 22 to be restricted.

In FIG. 3, the fourth n-channel transistor 14 and the p-channel transistor 24 function as a high-resistance load transistor and restrict the current flowing into the active load transistors 12 and 13 by the ON-state resistance. By virtue of this, the through current, which flows upon a change in the input signal 4, can be reduced.

Figure 4:
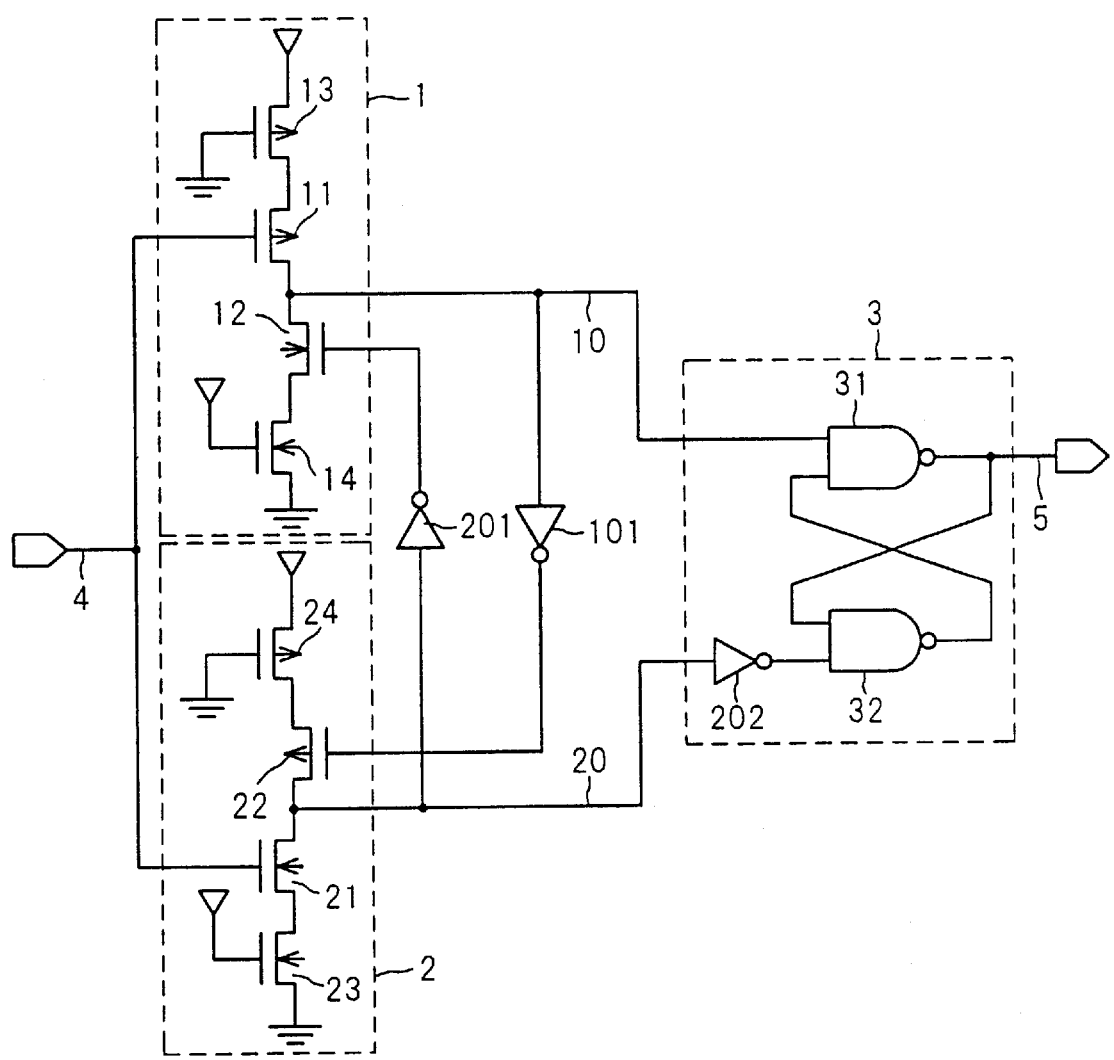
FIG. 4 is a block diagram illustrating the construction of a Schmitt trigger circuit according to the fourth preferred embodiment of the invention.

FIG. 4 is a block diagram showing the construction of the Schmitt trigger circuit according to the fourth preferred embodiment of the invention. This Schmitt trigger circuit has a construction such that the low-resistance load transistor 13 for regulating the threshold voltage and the high-resistance load transistor 14 for restricting the through current are provided in the first inverting amplifier circuit 1 while the low-resistance load transistor 23 for regulating the threshold voltage and the high-resistance load transistor 24 for restricting the through current are provided in the second inverting amplifier circuit 2. This construction enables the Schmitt trigger circuit to cope with low power supply voltage and input of a signal with small amplitude.

Figure 5:
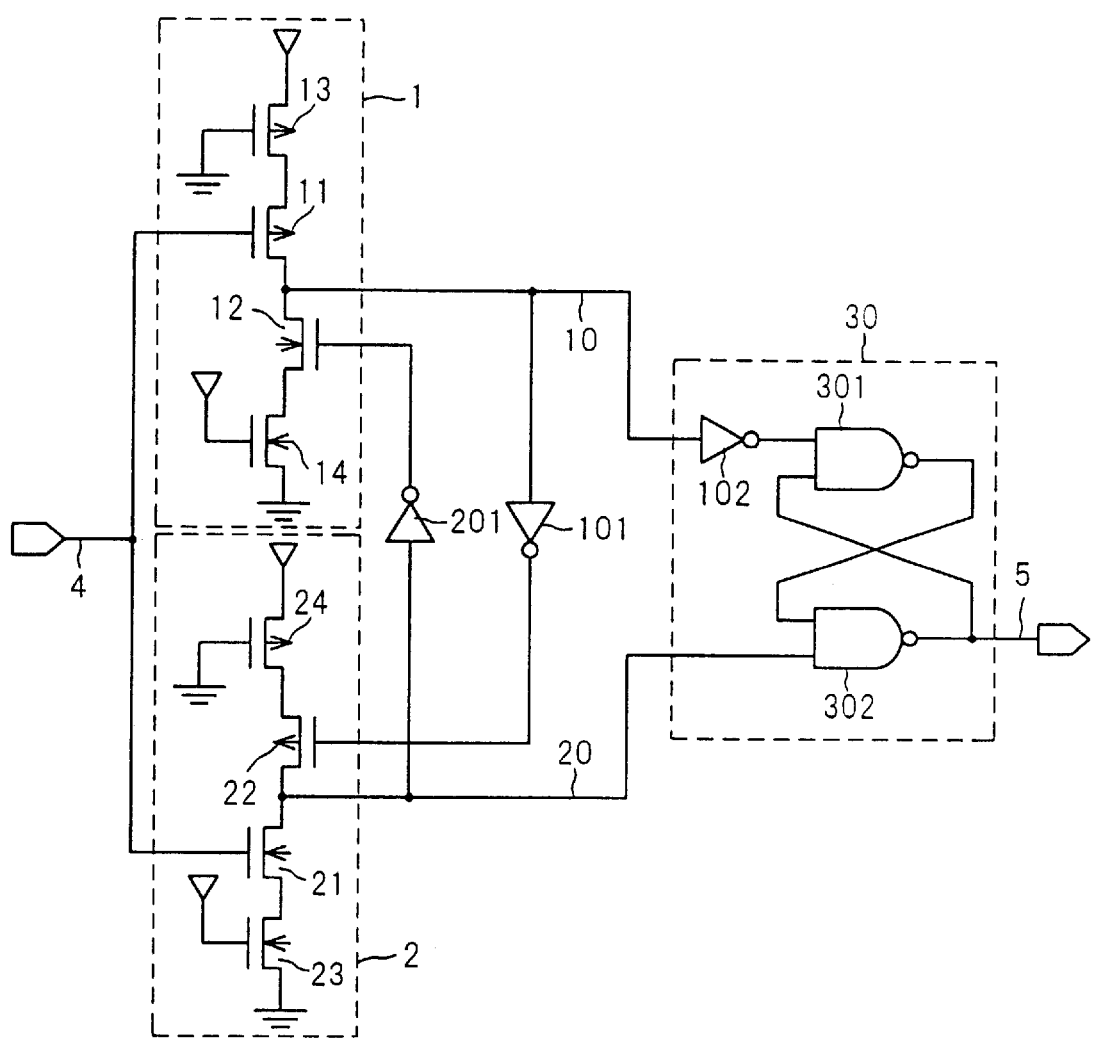
FIG. 5 is a block diagram illustrating the construction of a Schmitt trigger circuit according to the fifth preferred embodiment of the invention.
Figure 6:
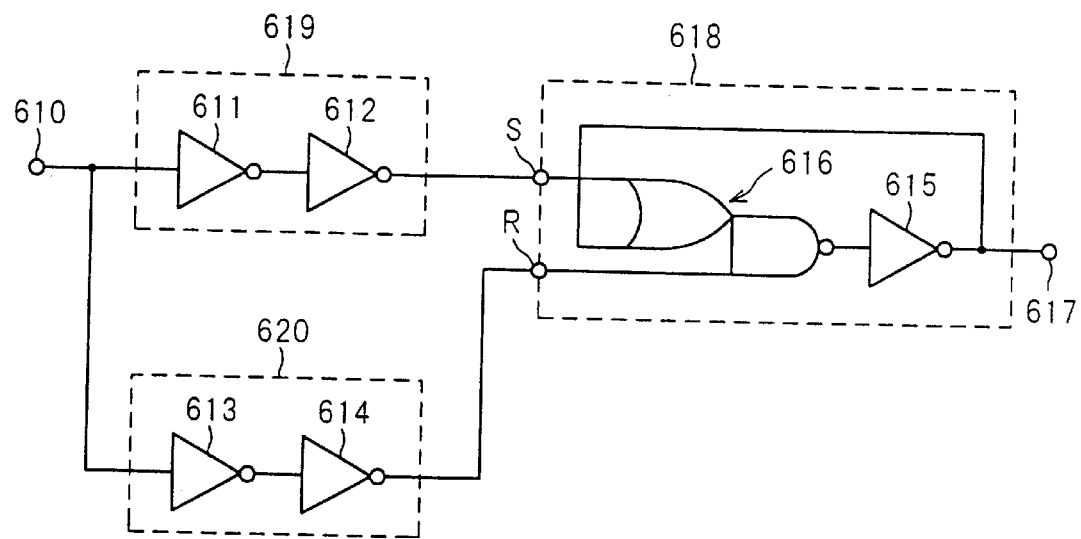
FIG. 6 is a block diagram illustrating the construction of a first conventional Schmitt trigger circuit.
Figure 7:
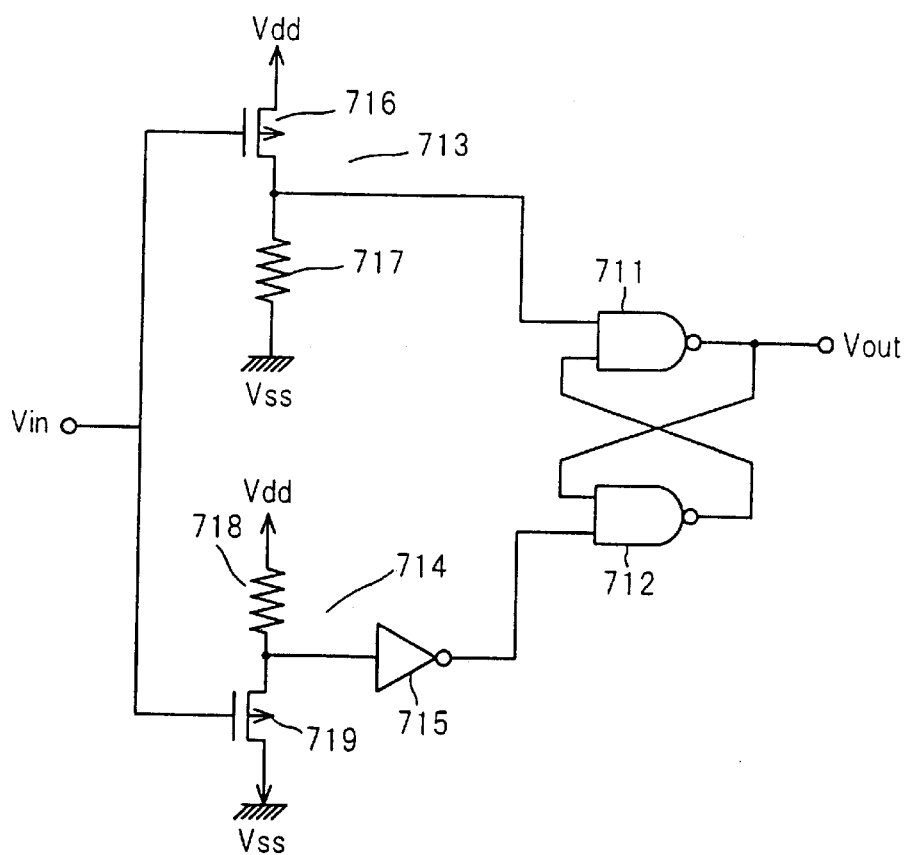
FIG. 7 is a block diagram illustrating the construction of a second Schmitt trigger circuit.

FIG. 5 is a block diagram illustrating the construction of the Schmitt trigger circuit according to the fifth preferred embodiment of the invention, wherein the flip-flop circuit 30 comprises two two-input NOR circuits 301 and 302 and an inversion circuit 102.

In FIG. 5, the first input signal level decision signal 10 is input through the inversion circuit 102 into one of the inputs in the first two-input NOR circuit, the second input: signal level decision signal 20 is input into one of the inputs in the second two-input NOR circuit, and the output from the first NOR circuit is connected to the other input in the second NOR circuit while the output from the second NOR circuit is connected to the other input in the first NOR circuit. In this construction, the output from the second NOR circuit 302 is used as the output signal 5. The operation of the flip-flop circuit 30 is the same as that of the flip-flop circuit 3.

These Schmitt trigger circuits comprise p-channel transistors and n-channel transistors. Therefore, it is needless to say that a conventional CMOS process can be applied to produce them.

As described above, the Schmitt trigger circuit of the invention has a construction such that, in two inverting amplifier circuits different from each other in threshold voltage, an inverted signal of an output signal from the first: inverting amplifier circuit is supplied to the gate in a load MOS transistor in the second inverting amplifier circuit, while an inverted signal of an output signal from the second inverting amplifier circuit is supplied to the gate in a load MOS transistor in the first inverting amplifier circuit. By virtue of this construction, no current flows when the input signal is in a stationary state, contributing to reduced power consumption.

Further, each threshold voltage is set by each one corresponding transistor. This can advantageously reduce the influence of a variation in production conditions and a variation in characteristics of transistors and thus can improve hysteresis characteristics.

The invention has been described in detail with particular reference to preferred embodiments, but it will be understood that variations and modifications can be effected within the scope of the invention as set forth in the appended claims.

What is claimed is:

1. A Schmitt trigger circuit comprising:
   a first inverting amplifier circuit comprising a first p-channel transistor, with a source connected to a power supply potential side, having a first set threshold voltage level and a first load n-channel transistor with a source connected to a ground potential side, wherein the first p-channel transistor in its drain is connected to the first load n-channel transistor in its drain and an input signal is supplied and connected to a gate in the first p-channel transistor while a first input signal level decision signal is output from the first p-channel transistor on its drain side;

a second inverting amplifier circuit comprising a second n-channel transistor, with a source connected to the ground potential side, having a second set threshold voltage level and a second load p-channel transistor with a source connected to a power supply potential side, wherein the second n-channel transistor in its drain is connected to the second load p-channel transistor in its drain and said input signal is supplied and connected to a gate in the second n-channel. transistor while a second input signal level decision signal is output from the second n-channel transistor on its drain side; and a flip-flop circuit into which the first input signal level decision signal is input as one input while the second input signal level decision signal is input as another input, an output from the flip-flop circuit being used as an output signal, an inverted signal of the second input signal level decision signal being supplied and connected to the first load n-channel transistor at its gate, an inverted signal of the first input signal level decision signal being supplied and connected to the second load p-channel transistor at its gate.

2. The Schmitt trigger circuit according to claim 1, which further comprises: a third p-channel transistor which is inserted into between the first p-channel transistor and the power supply potential side and has a gate connected to the ground potential; and a third n-channel transistor which is inserted into between the second n-channel transistor and the ground potential side and has a gate connected to the power supply potential, said third p-channel transistor and said n-channel transistor being respectively a low-resistance load transistor for regulating the threshold voltage of the first p-channel transistor and a low-resistance load transistor for regulating the threshold voltage of the second n-channel transistor.

3. The Schmitt trigger circuit according to claim 1, which further comprises: a fourth n-channel transistor which is inserted into between the first load n-channel transistor and the ground potential side and has a gate connected to the power supply potential; and a fourth p-channel transistor which is inserted into between the second load p-channel transistor and the power supply potential side and has a gate connected to the ground potential, said fourth n-channel transistor and said p-channel transistor being respectively a high-resistance load transistor for restricting a current flowing through the first load n-channel transistor and the second load p-channel transistor.

4. The Schmitt trigger circuit according to claim 1, which further comprises all of the third p-channel transistor and n-channel transistor as the low-resistance load transistor for regulating the threshold voltage according to claim 2 and the fourth n-channel transistor and p-channel transistor as the high-resistance load transistor for restricting the current according to claim 3.

5. The Schmitt trigger circuit according to claim 1, wherein:

said flip-flop circuit comprises two two-input NAND circuits of first and second two-input NAND circuits and a first inversion circuit;

the first input signal level decision signal is input into one of the two inputs in the first two-input NAND circuit, while the second input signal level decision signal is input through the first inversion circuit into one of the two inputs in the second two-input NAND circuit; and the output from the first two-input NAND circuit is used as the output signal and, in addition, is input into the other input in the second two-input NAND circuit, while the output from the second two-input NAND circuit is input into the other input in the first two-input NAND circuit.

6. The Schmitt trigger circuit according to claim 1, wherein:

said flip-flop circuit comprises two two-input NOR circuits of first and second two-input NOR circuits and a second inversion circuit;

the first input signal level decision signal is input through the second inversion circuit into one of the two inputs in the first two-input NOR circuit, while the second input signal level decision signal is input into one of the two inputs in the second two input NOR circuit; and the output from the second two-input NOR circuit is used as the output signal and, in addition, is input into the other input in the first two-input NOR circuit, while the output from the first two-input NOR circuit is input into the other input in the second two-input NOR circuit.

7. The Schmitt trigger circuit according to claim 1, which has been produced by CMOS process.

8. The Schmitt trigger circuit according to claim 2, wherein:

said flip-flop circuit comprises two two-input NAND circuits of first and second two-input NAND circuits and a first inversion circuit;

the first input signal level decision signal is input into one of the two inputs in the first two-input NAND circuit, while the second input signal level decision signal is input through the first inversion circuit into one of the two inputs in the second two-input NAND circuit; and the output from the first two-input NAND circuit is used as the output signal and, in addition, is input into the other input in the second two-input NAND circuit, while the output from the second two-input NAND circuit is input into the other input in the first two-input NAND circuit.

9. The Schmitt trigger circuit according to claim 3, wherein:

said flip-flop circuit comprises two two-input NAND circuits of first and second two-input NAND circuits and a first inversion circuit;

the first input signal level decision signal is input into one of the two inputs in the first two-input NAND circuit, while the second input signal level decision signal is input through the first inversion circuit into one of the two inputs in the second two-input NAND circuit; and the output from the first two-input NAND circuit is used as the output signal and, in addition, is input into the other input in the second two-input NAND circuit, while the output from the second two-input NAND circuit is input into the other input in the first two-input NAND circuit.

10. The Schmitt trigger circuit according to claim 4 wherein:

said flip-flop circuit comprises two two-input NAND circuits of first and second two-input NAND circuits and a first inversion circuit;

the first input signal level decision signal is input into one of the two inputs in the first two-input NAND circuit, while the second input signal level decision signal is input through the first inversion circuit into one of the two inputs in the second two-input NAND circuit; and the output from the first two-input NAND circuit is used as the output signal and, in addition, is input into the other input in the second two-input NAND circuit, while the output from the second two-input NAND circuit is input into the other input in the first two-input NAND circuit.

11. The Schmitt trigger circuit according to claim 2, wherein:
said flip-flop circuit comprises two two-input NOR circuits of first and second two-input NOR circuits and a second inversion circuit;
the first input signal level decision signal is input through the second inversion circuit into one of the two inputs in the first two-input NOR circuit, while the second input signal level decision signal is input into one of the two inputs in the second two-input NOR circuit; and
the output from the second two-input NOR circuit is used as the output signal and, in addition, is input into the other input in the first two-input NOR circuit, while the output from the first two-input NOR circuit is input into the other input in the second two-input NOR circuit.

12. The Schmitt trigger circuit according to claim 3, wherein:
said flip-flop circuit comprises two two-input NOR circuits of first and second two-input NOR circuits and a second inversion circuit;
the first input signal level decision signal is input through the second inversion circuit into one of the two inputs in the first two-input NOR circuit, while the second input signal level decision signal is input into one of the two inputs in the second two-input NOR circuit; and
the output from the second two-input NOR circuit is used as the output signal and, in addition, is input into the other input in the first two-input NOR circuit, while the output from the first two-input NOR circuit is input into the other input in the second two-input NOR circuit.

13. The Schmitt trigger circuit according to claim 4, wherein:
said flip-flop circuit comprises two two-input NOR circuits of first and second two-input NOR circuits and a second inversion circuit;
the first input signal level decision signal is input through the second inversion circuit into one of the two inputs in the first two-input NOR circuit, while the second input signal level decision signal is input into one of the two-inputs in the second two-input NOR circuit; and
the output from the second two-input NOR circuit is used as the output signal and, in addition, is input into the other input in the first two-input NOR circuit, while the output from the first two-input NOR circuit is input into the other input in the second two-input NOR circuit.

14. The Schmitt trigger circuit according to claim 2, which has been produced by CMOS process.

15. The Schmitt trigger circuit according to claim 3, which has been produced by CMOS process.

16. The Schmitt trigger circuit according to claim 4, which has been produced by CMOS process.

17. The Schmitt trigger circuit according to claim 5, which has been produced by CMOS process.

18. The Schmitt trigger circuit according to claim 6, which has been produced by CMOS process.

19. The Schmitt trigger circuit according to claim 8, which has been produced by CMOS process.

20. The Schmitt trigger circuit according to claim 9, which has been produced by CMOS process.

21. The Schmitt trigger circuit according to claim 10, which has been produced by CMOS process.

22. The Schmitt trigger circuit according to claim 11, which has been produced by CMOS process.

23. The Schmitt trigger circuit according to claim 12, which has been produced by CMOS process.

24. The Schmitt trigger circuit according to claim 13, which has been produced by CMOS process.

* * * * *